(12) United States Patent
Yukawa

(10) Patent No.: US 11,039,560 B2
(45) Date of Patent: Jun. 15, 2021

(54) WORKING MACHINE, STORING-TARGET-BODY SUPPLY DEVICE, AND METHOD FOR MANUFACTURING WORKPIECE HAVING STORING-TARGET BODY INSTALLED THEREON

(71) Applicant: Panasonic Intellectual Property Management Co., Ltd., Osaka (JP)

(72) Inventor: Hiroki Yukawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 332 days.

(21) Appl. No.: 16/153,952

(22) Filed: Oct. 8, 2018

(65) Prior Publication Data

US 2019/0116700 A1  Apr. 18, 2019

(30) Foreign Application Priority Data

Oct. 16, 2017  (JP) .............................. JP2017-199994

(51) Int. Cl.
*H05K 13/04* (2006.01)
*H05K 13/02* (2006.01)
*H05K 13/08* (2006.01)

(52) U.S. Cl.
CPC ....... *H05K 13/0419* (2018.08); *H05K 13/021* (2013.01); *H05K 13/0406* (2018.08); *H05K 13/0417* (2013.01); *H05K 13/087* (2018.08); *H05K 13/086* (2018.08); *Y10T 29/53178* (2015.01)

(58) Field of Classification Search
CPC ............. H05K 13/021; H05K 13/0417; H05K 13/0419; H05K 13/086; Y10T 29/4913; Y10T 29/53174
See application file for complete search history.

(56) References Cited

U.S. PATENT DOCUMENTS

| 4,657,158 A | * | 4/1987 | Faes | .................. | H05K 13/0419 221/25 |
| 6,318,437 B1 | * | 11/2001 | Yoo | .................... | H05K 13/0419 156/750 |
| 2010/0147649 A1 | * | 6/2010 | Wu | .................... | H05K 13/0419 198/341.01 |

FOREIGN PATENT DOCUMENTS

WO  2014-118994 A1  8/2014

* cited by examiner

*Primary Examiner* — Peter Dungba Vo
*Assistant Examiner* — Joshua D Anderson
(74) *Attorney, Agent, or Firm* — Pearne & Gordon LLP

(57) ABSTRACT

A working machine causes a working mechanism to install, on a workpiece, a storing-target body stored in a tape. The working machine includes: a storing-target-body supply device that supplies the storing-target body stored in the tape to the working mechanism; and a drive device that gives a drive force to the storing-target-body supply device. The storing-target-body supply device includes a supply-reel storage that stores a supply reel around which the tape storing the storing-target body is wound, a tape feed mechanism that unwinds the tape from the supply reel so as to feed the storing-target body to a predetermined supply position, and a drive transmitting mechanism that transmits, to the tape feed mechanism, the drive force given from the drive device.

19 Claims, 7 Drawing Sheets

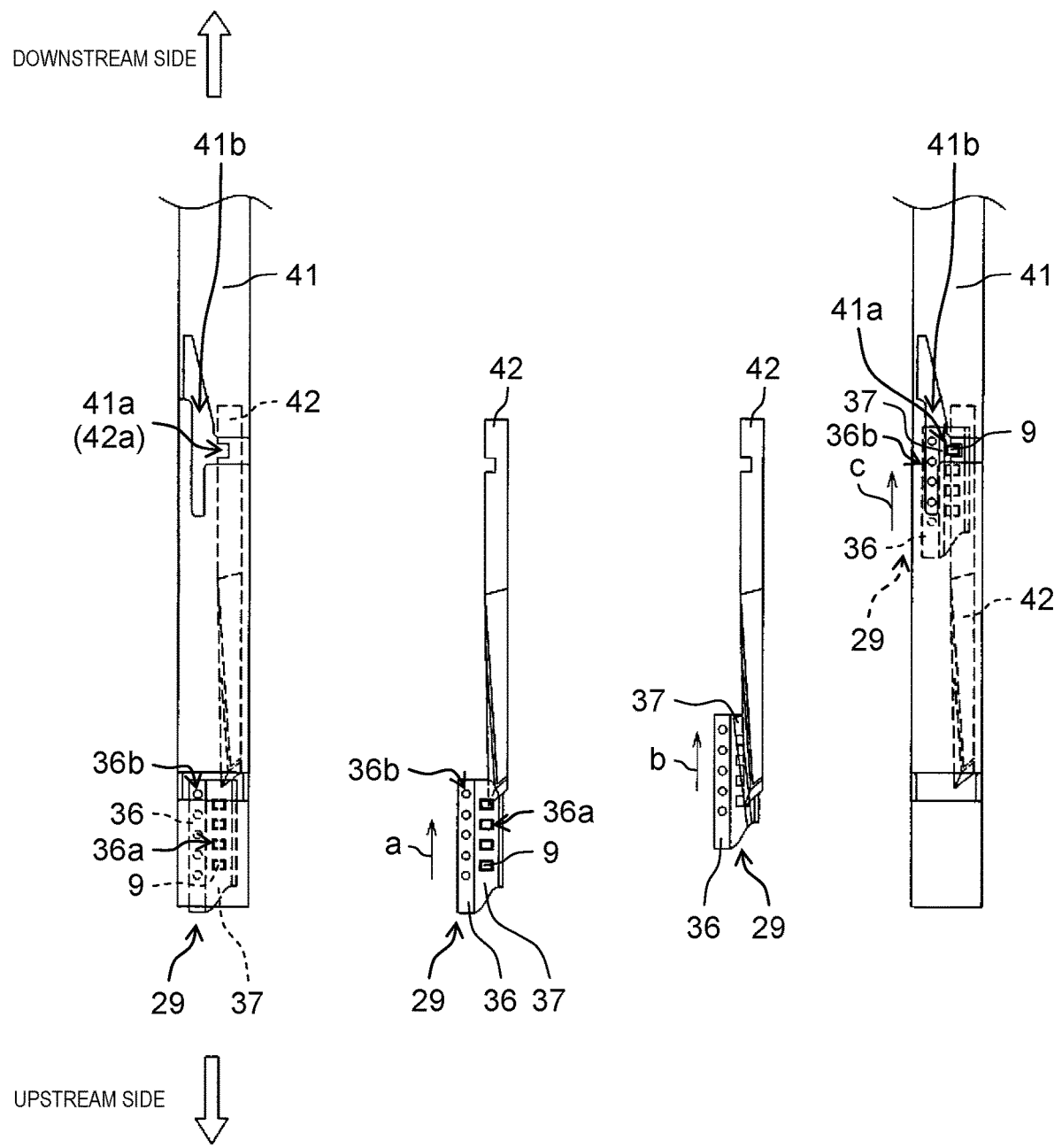

WORKING MACHINE, STORING-TARGET-BODY SUPPLY DEVICE, AND METHOD FOR MANUFACTURING WORKPIECE HAVING STORING-TARGET BODY INSTALLED THEREON

BACKGROUND

1. Technical Field

The present disclosure relates to a working machine, a storing-target-body supply device, and a method for manufacturing a workpiece having a storing-target-body installed thereon.

2. Description of the Related Art

In a mounting field in which a component is mounted on a board by a component installing machine as a working machine, there has been widely known a tape feeder that unwinds a tape storing a component from a reel and supplies the component to a working mechanism such as an installation head. In recent years, as an example of the tape feeder, there is proposed a cassette-type tape feeder in which a reel is stored in a cassette case, which is a housing, and the cassette case is detachably attachable to a feeder attaching portion provided in a component installing machine (for example, see International Publication No. 2014/118994).

In an example disclosed in International Publication No. 2014/118994, a tape loading portion in which a tape reel, around which a component supply tape is wound, is loaded and a tape feed mechanism that feeds the component supply tape unwound from the tape reel are provided in the cassette case. The tape feed mechanism includes a sprocket that meshes with sprocket holes formed in the component supply tape, and a drive motor that rotatably drives the sprocket or a control device that controls the drive motor or the like is further provided in the cassette case.

SUMMARY

According to an aspect of the disclosure, there is provided a working machine that causes a working mechanism to install, on a workpiece, a storing-target body stored in a tape, the working machine including: a storing-target-body supply device that supplies the storing-target body stored in the tape to the working mechanism; and a drive device that gives a drive force to the storing-target-body supply device. The storing-target-body supply device includes a supply-reel storage that stores a supply reel around which the tape storing the storing-target body is wound, a tape feed mechanism that unwinds the tape from the supply reel so as to feed the storing-target body to a predetermined supply position, and a drive transmitting mechanism that transmits, to the tape feed mechanism, the drive force given from the drive device.

According to another aspect of the disclosure, there is provided a storing-target-body supply device that supplies a storing-target body stored in a tape, the device including: a supply-reel storage that stores a supply reel around which the tape storing the storing-target body is wound, a tape feed mechanism that unwinds the tape from the supply reel so as to feed the storing-target body to a predetermined supply position, and a drive transmitting mechanism that transmits, to the tape feed mechanism, a drive force given from the outside.

According to still another aspect of the disclosure, there is provided a working machine that causes a working mechanism to install, on a workpiece, a storing-target body stored in a tape, the working machine including: an attaching portion to which a storing-target-body supply device that supplies the storing-target body stored in the tape to the working mechanism is detachably attached; and a drive device that gives a drive force to the storing-target-body supply device attached to the attaching portion.

According to still another aspect of the disclosure, there is provided a method for manufacturing a workpiece on which a storing-target body is installed, the method including: a storing-target-body supplying step of supplying the storing-target body to a predetermined supply position by using a working machine that includes a storing-target-body supply device that supplies the storing-target body stored in a tape to a working mechanism and a drive device that gives a drive force to the storing-target-body supply device, the storing-target-body supply device including a supply-reel storage that stores a supply reel around which the tape storing the storing-target body is wound, a tape feed mechanism that unwinds the tape from the supply reel so as to feed the storing-target body to the predetermined supply position, and a drive transmitting mechanism that transmits, to the tape feed mechanism, the drive force given from the drive device; and an installing step of installing the supplied storing-target body on the workpiece by using the working mechanism.

According to the aspects of the disclosure, it is possible to reduce costs with a simple configuration.

BRIEF DESCRIPTION OF THE DRAWINGS

FIG. 6A is a view illustrating a tape peeling-off operation by the tape feeder according to the exemplary embodiment of the disclosure;

FIG. 6B is a view illustrating the tape peeling-off operation by the tape feeder according to the exemplary embodiment of the disclosure;

FIG. 6C is a view illustrating the tape peeling-off operation by the tape feeder according to the exemplary embodiment of the disclosure;

FIG. 6D is a view illustrating the tape peeling-off operation by the tape feeder according to the exemplary embodiment of the disclosure.

DETAILED DESCRIPTION

In the related art, a drive motor and a control device are provided, and thereby problems arise in that a tape feeder increases in size and cost. In addition, it is necessary to generate a program for performing a mounting process between a control device in the tape feeder and a control device on a component installer, and thus the component installer and the tape feeder have a complicated structure. In particular, since multiple tape feeders are set on the component installer, and thus it is also necessary to prepare another component for replacement in case there is a shortage of components, a problem arises in that the high cost of the tape feeder significantly influences an increase in cost of a product that is manufactured by not only the component installer but also a product that is manufactured by the component installer.

According to the disclosure, an object thereof is to provide a working machine, a storing-target-body supply device, and a method for manufacturing a workpiece on which a storing-target body is installed by the working machine, by which it is possible to reduce costs in a simplified configuration.

The working machine according to an exemplary embodiment of the disclosure will be described with reference to the figures. The working machine according to the exemplary embodiment causes a working mechanism, which will be described below, to install, on a workpiece, a storing-target body stored in a tape. In the exemplary embodiment, a component installer is exemplified as the working machine, an electronic component (hereinafter, simply referred to as a "component") is exemplified as the storing-target body, and a board, on which an electronic circuit is formed, is exemplified as the workpiece. Hereinafter, a transporting direction of the board is defined as an X-axis direction, and a direction orthogonal to the X-axis direction in a horizontal plane is defined as a Y-axis direction. In addition, a direction orthogonal to an XY plane is defined as a Z-axis direction.

Figure 1:
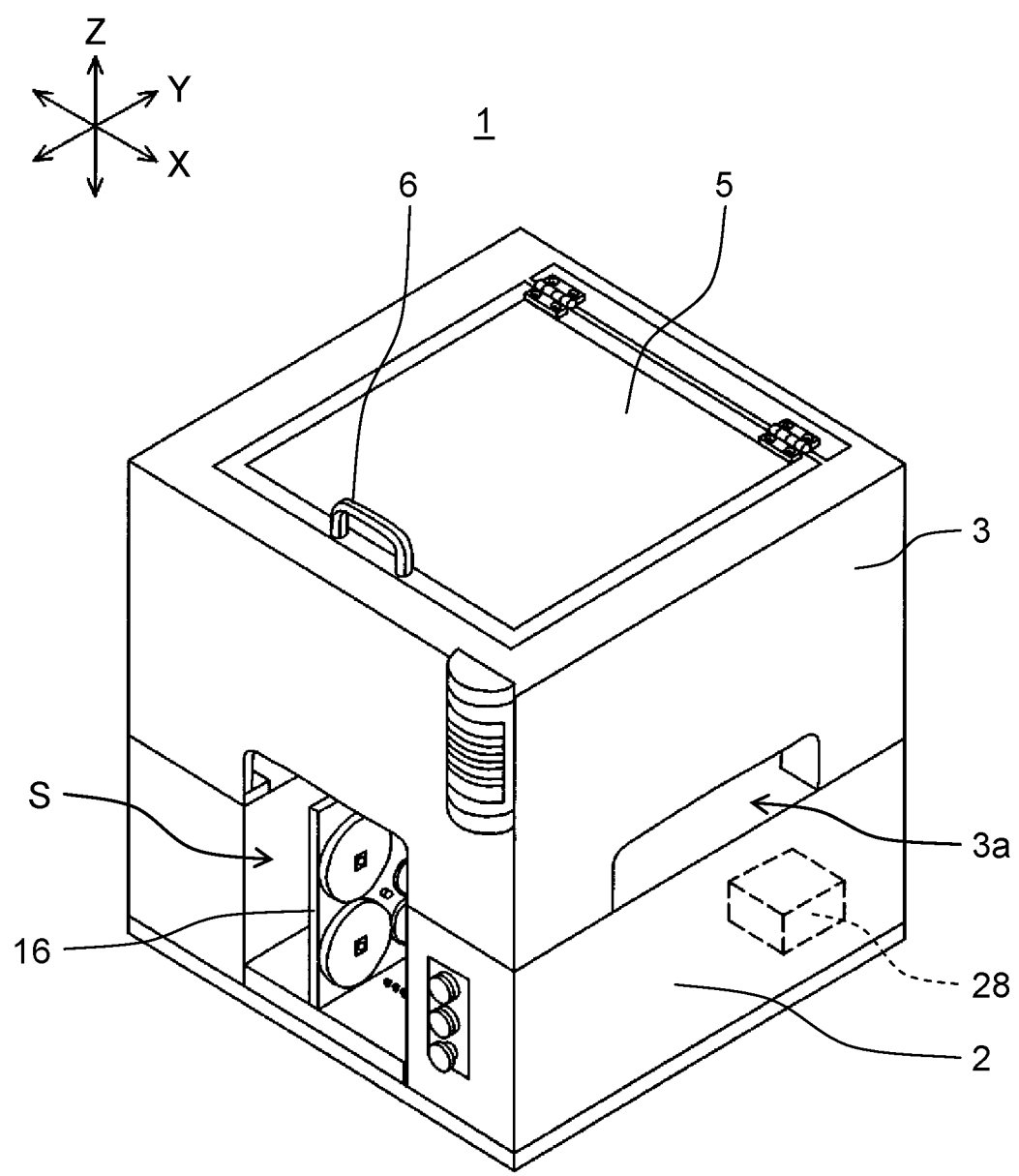
FIG. 1 is a perspective view schematically illustrating a component installer according to an exemplary embodiment of the disclosure.

In FIG. 1, component installer 1 includes base member (lower main body portion) 2 and upper main body portion 3 that is installed to cover base member 2 from above. Base member 2 has a substantially recessed shape having a space S at a central portion, which is open upward, when viewed from a side in the Y-axis direction that is a direction in which an operator (not illustrated) accesses component installer 1. Opening portions 3a for loading and unloading board 4 (FIG. 2) are formed at both ends of upper main body portion 3 in the X-axis direction. Transparent window portion 5, which is openable and closable by a hinge mechanism, is provided in an upper portion of upper main body portion 3, and thus the operator is able to visually recognize an inside of the installer from above via window portion 5. Window portion 5 has handle 6, and thus the operator holds handle 6 at a time of maintenance working such that window portion 5 is opened, and thereby it is possible to access the inside of the installer.

Figure 2:
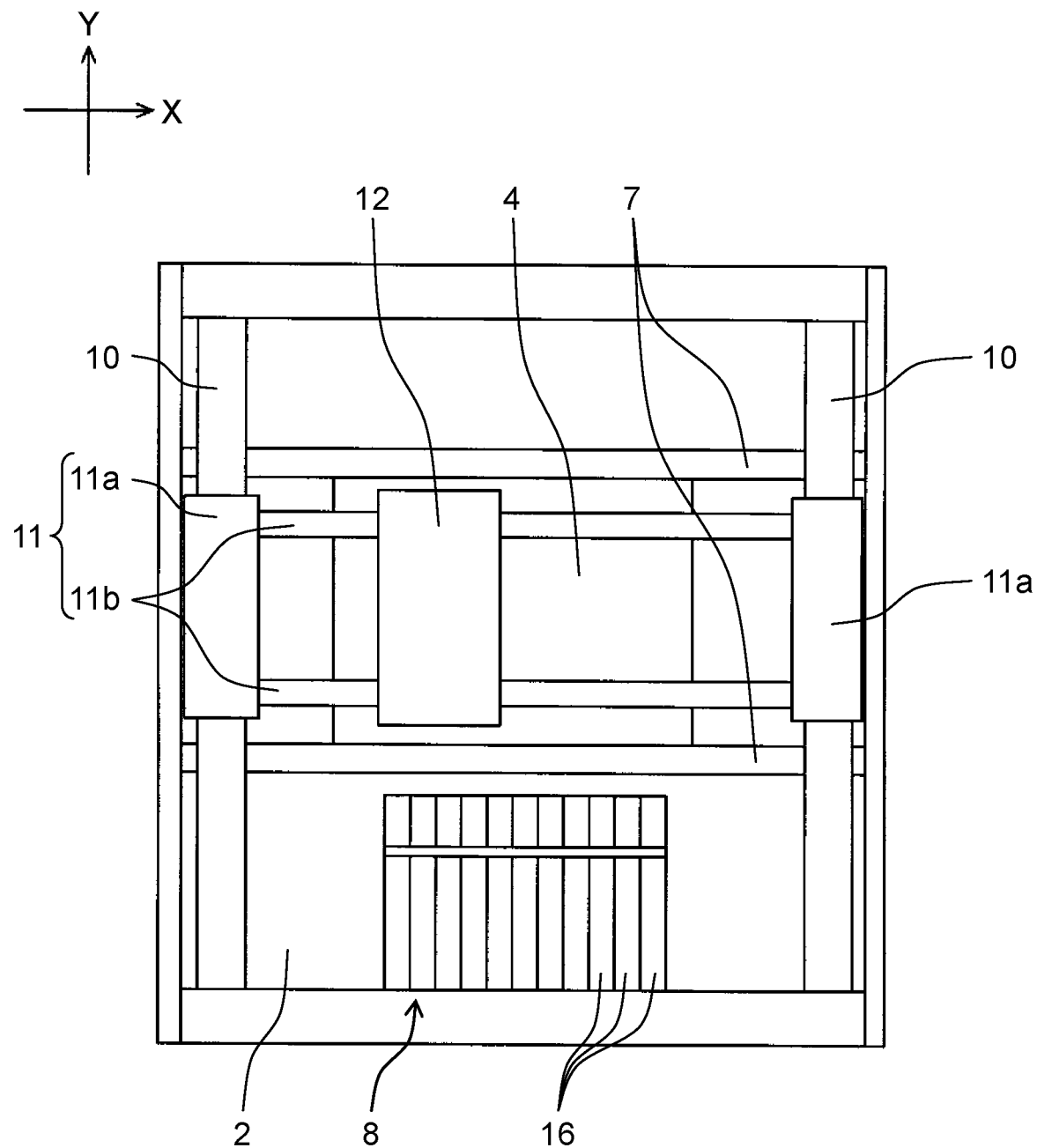
FIG. 2 is a plan view schematically illustrating the component installer according to the exemplary embodiment of the disclosure.

In FIG. 2, board transporting mechanism 7 provided with a pair of transport conveyers extending in the X-axis direction is provided at the central portion of base member 2. Board transporting mechanism 7 transports board 4 and positions the board at a predetermined position. Component supplier 8 is provided on one side of board transporting mechanism 7, that is, at a position corresponding to space S. Component supplier 8 supplies component 9 (FIGS. 6A to 6D) which is installed on board 4 to working head 12 constituting the working mechanism, which will be described below.

Y-axis beams 10 provided with a linear drive mechanism are provided to extend in the Y-axis direction at both side portions of base member 2 in the X-axis direction. Similarly, a plurality of X-axis beams 11, which are each provided with a linear drive mechanism, span Y-axis beams 10 so as to move freely in the Y-axis direction. X-axis beam 11 is configured to include slider 11a, which slides freely on Y-axis beams 10, and beam main body 11b, which is supported by slider 11a and extends in the X-axis direction.

Working head 12 is installed on the plurality of X-axis beams 11 so as to move freely in the X-axis direction. Beam main bodies 11b penetrate both ends of working head 12, and working head 12 moves along beam main bodies 1ib. Such a configuration enables working head 12 to move in the X-axis direction and the Y-axis direction by the drive of Y-axis beams 10 and X-axis beams 11. Working head 12 is a multi-type head and is provided with a plurality of component installing nozzles 13 (FIG. 3) on a lower side. Nozzles 13 move in the Z-axis direction by a lifting/lowering mechanism (not illustrated). Working head 12 holds, by nozzles 13, component 9 supplied by component supplier 8 and, then, installs the component on board 4 positioned at a predetermined working position. Y-axis beams 10, X-axis beams 11, and working head 12 are the working mechanism that performs working of installing component 9 on board 4.

Next, component supplier 8 will be described with reference to FIGS. 3 to 7. Component supplier 8 is provided on base member 2 and includes a step-shaped feeder base 14 having a step when viewed in a side view. Feeder base 14 may be formed in a unit with base member 2 or may be formed separately from base member 2. Feeder base 14 is separated from base member 2, and thereby the operator gains an easy access when tape feeder 16 is attached. Feeder base 14 functions as an attaching portion to which drive device 15 and tape feeder 16 as a storing-target-body supply device are detachably attached. Feeder base 14 is configured to include first attaching portion 14A, which is positioned on a central side of base member 2 and to which drive device 15 is attached, and second attaching portion 14B, which is positioned on a side separate from the center of base member 2 and to which tape feeder 16 is attached. A height position of an attaching surface of second attaching portion 14B is higher than a height position of an attaching surface of first attaching portion 14A. A top surface of second attaching portion 14B is exposed to space S such that the operator is able to access second attaching portion 14B.

Figure 3:
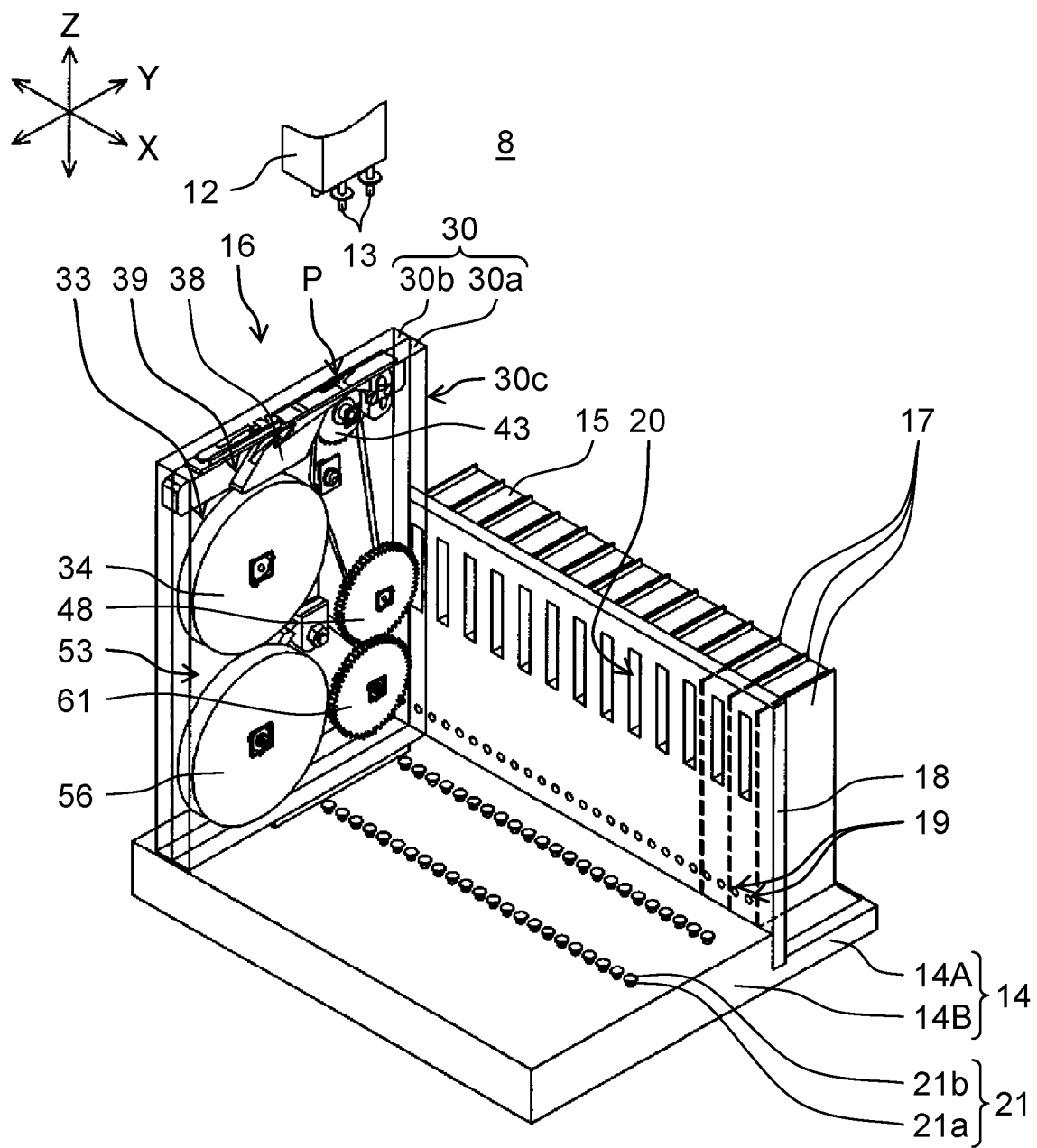
FIG. 3 is a perspective view schematically illustrating a component supplier and a tape feeder according to the exemplary embodiment of the disclosure.

In FIG. 3, on first attaching portion 14A, a plurality of stays 17 having a rectangular plate shape are provided to have an "upright posture" at a predetermined interval in the X-axis direction. Stays 17 are provided to fix drive device 15. An interval between adjacent stays 17 and 17 is set depending on a length dimension of tape feeder 16 in a width direction thereof. Rectangular bracket 18 extending in the X-axis direction is provided on a side portion of first attaching portion 14A, which is a boundary side with second attaching portion 14B. Bracket 18 is provided with a plurality of pinholes 19 on a lower side of the bracket, the pinholes being formed at a predetermined pitch in the X-axis direction in a state of being open to a side of second attaching portion 14B. In addition, bracket 18 is provided with opening portion 20 on an upper side thereof, the opening penetrating (being open through) the bracket in a thickness direction (Y-axis direction) at a predetermined pitch in the X-axis direction. Two pinholes 19 are disposed between adjacent stays 17 and 17, and one opening portion 20 is disposed between adjacent stays 17 and 17. For convenience, stays 17 are omitted in FIG. 4.

A plurality of pairs of projecting bodies 21 are provided at corresponding positions between adjacent stays 17 and 17, on a top surface of second attaching portion 14B, the projecting bodies being provided at a predetermined pitch in the Y-axis direction which is an insertion direction of tape feeder 16. Projecting body 21 is configured to have base portion 21a, which is fixed to second attaching portion 14B, and flange portion 21b provided on a top portion of base portion 21a. Projecting bodies 21 and pinholes 19 are used when tape feeder 16 is positioned with respect to feeder base 14.

Figure 4:
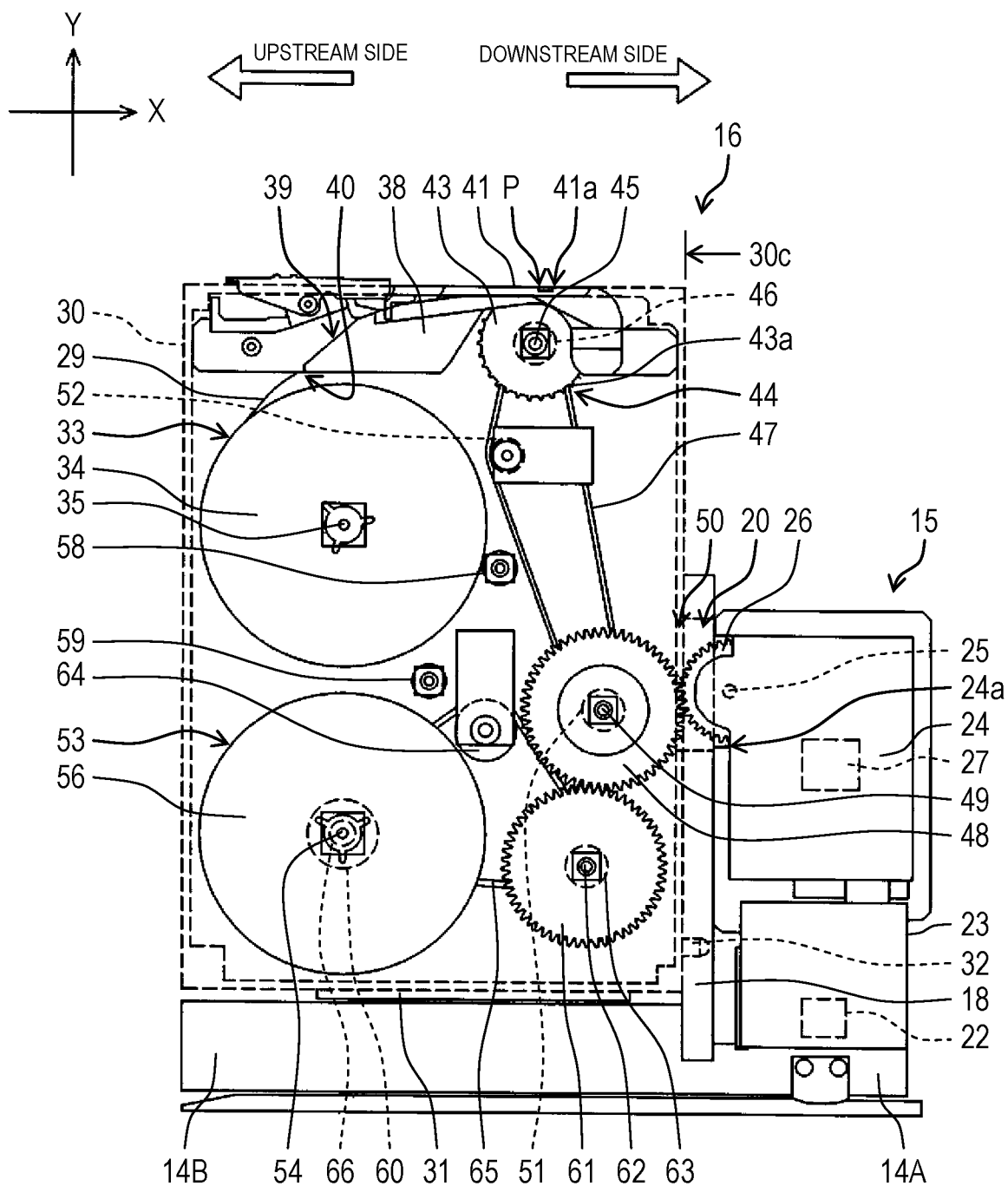
FIG. 4 is a view illustrating a structure of the component supplier and the tape feeder according to the exemplary embodiment of the disclosure.

In FIG. 3, drive device 15 is disposed between adjacent stays 17 and 17. In FIG. 4, drive device 15 gives a drive force to tape feeder 16 attached to feeder base 14 and is configured to have a fixing-target unit 23, in which driver 22 is internally provided and which is fixed to first attaching portion 14A, and housing 24, which is disposed on fixing-target unit 23 and is fixed to stays 17. Housing 24 is provided with opening portion 24a formed at a position at which communication with opening portion 20 of bracket 18 is performed on an upper side on a surface of the housing which is opposite to second attaching portion 14B.

In housing 24, drive gear 26 that is rotatably supported by rotary shaft 25 is provided, and a part of drive gear 26 is exposed to the outside of housing 24 via opening portion 24a. Drive gear 26 is rotatably driven by drive motor 27 provided inside housing 24. Driver 22 receives an instruction from controller 28 (FIG. 1) provided in component installer 1 and drives drive motor 27. Controller 28 controls various types of drive mechanisms constituting component installer 1. In the exemplary embodiment, feeder base 14 and drive device 15 are disposed on a side of component installer 1. As described above, drive device 15 includes drive gear 26 and drive motor 27 that rotatably drives drive gear 26.

Tape feeders 16 supply, to a working mechanism, component 9 stored on component supply tape (hereinafter, simply referred to as a "tape") 29 and are attached on feeder base 14 in an aligned state in the X-axis direction. In FIGS. 3 and 4, tape feeder 16 is formed in a cassette type feeder having cassette case 30, which is a housing, as a main body. Cassette case 30 is molded in a resin material and is configured to have first case 30a and second case 30b which are installed on each other, the second case being attachable to and detachable from first case 30a (FIG. 3). For example, first case 30a and second case 30b are installed on each other, with a hook portion (not illustrated) formed on first case 30a being hooked into a hooking-target portion formed on second case 30b. Hooking means by the hooking-target portion is not limited to the exemplary embodiment. For example, both cases may be installed on each other by a magnetic body, a screw stopper, or the like.

Figure 5A:
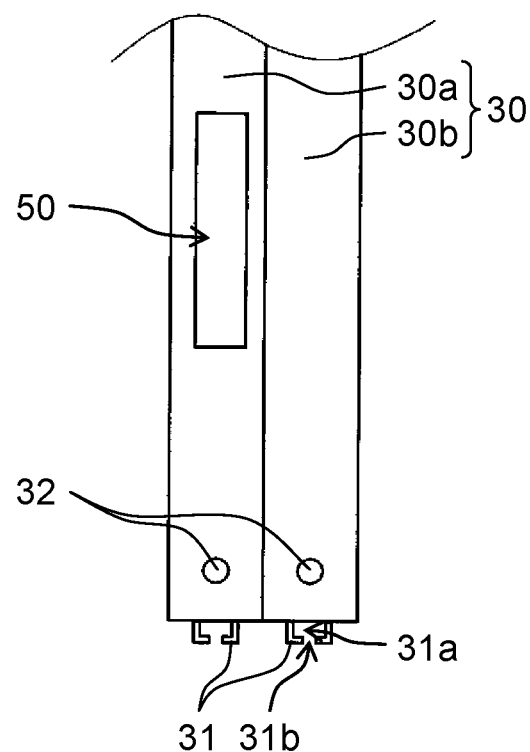
FIG. 5A is a partial front view schematically illustrating the component supplier and the tape feeder according to the exemplary embodiment of the disclosure.
Figure 5B:
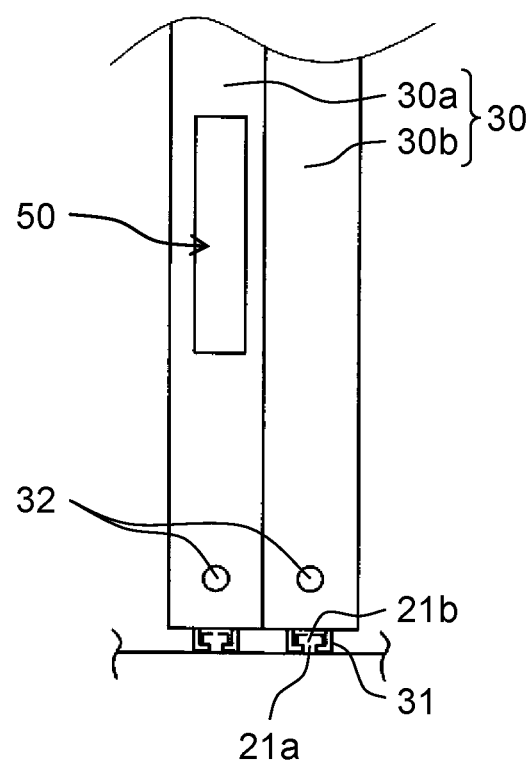
FIG. 5B is a partial front view schematically illustrating the component supplier and the tape feeder according to the exemplary embodiment of the disclosure.

In FIGS. 4, 5A, and 5B, rail member 31 is provided in a longitudinal direction on each undersurface of first case 30a and second case 30b. Rail member 31 is provided with accommodation 31a which is a space that is capable of accommodating flange 21b of projecting body 21. Communication port 31b for communicating with accommodation 31a is formed substantially at the center of a bottom portion of rail member 31. Pin member 32 that is insertable into pinhole 19 is provided at a lower position of side surface 30c (FIG. 4) which is opposite to drive device 15, on each of first case 30a and second case 30b. In a state in which base portion 21a of projecting body 21 passes through communication port 31b in the bottom portion of rail member 31, flange 21b is in contact with the bottom portion of rail member 31 from above. From this state, when cassette case 30 is caused to slide to a side of drive device 15, pin member 32 is inserted into pinhole 19. Consequently, tape feeder 16 is attached to feeder base 14. Since the top surface of second attaching portion 14B is exposed to space S, the operator is able to manually attach and detach tape feeder 16. For convenience, in FIGS. 5A and 5B, various members provided in cassette case 30 are omitted in the figures.

In FIG. 4, supply-reel storage 33 is provided at an upper position in cassette case 30. Supply reel 34 is stored in supply-reel storage 33, and tape 29 storing component 9 which is a supply target to the working mechanism is wound around supply reel 34. Supply reel 34 is rotatably supported by rotary shaft 35.

In FIGS. 6A to 6D, tape 29 is configured to have bottom tape 36 and cover tape 37 that is bonded with an adhesive or the like from a side above bottom tape 36. Bottom tape 36 is provided with storing recessed portion 36a storing component 9 at a predetermined pitch in the longitudinal direction. In one side portion of bottom tape 36, sprocket holes 36b, which penetrate the bottom tape in a thickness direction and mesh with feed hooks 43a of sprocket 43 constituting a tape feed mechanism to be described below, are formed at a predetermined pitch in the longitudinal direction. Cover tape 37 covers a top surface of bottom tape 36 excluding a region in which sprocket holes 36b are formed.

In FIG. 4, main body frame 38 is provided inside cassette case 30, at an upper position of supply-reel storage 33. Tape guideway 39 is formed in main body frame 38. An upstream side (left side on the paper) of tape guideway 39 communicates with tape introducing port 40 for introducing tape 29 unwound from supply reel 34. A downstream side (right side on the paper) of tape guideway 39 communicates with a discharge port (not illustrated) for discharging tape 29 from a position beyond supply position P. Tape guideway 39 is used to guide tape 29 introduced from tape introducing port 40 to supply position P. Supply position P is a position at which working head 12 picks up component 9, that is, a position at which component 9 is supplied to the working mechanism.

In FIGS. 4 and 6A to 6D, tape retaining member 41 is provided above tape guideway 39 including supply position P. Picking-up opening 41a is formed at a position of tape retaining member 41 which corresponds to supply position P, and nozzle 13 picks up component 9 stored in tape 29 via picking-up opening 41a. In FIG. 6A, tape retaining member 41 includes peeling blade 42 having sharp blade edge pointing toward the upstream side. Peeling blade 42 is provided with notched portion 42a at a position corresponding to supply position P.

As illustrated in FIG. 6A, when a leading head of tape 29 traveling downstream reaches peeling blade 42, the blade edge enters space between bottom tape 36 and cover tape 37, and tape peeling is started. Subsequently, as illustrated in FIGS. 6B and 6C, as tape 29 further travels downstream (arrows a and b), a peeling range of cover tape 37 is expanded. As illustrated in FIG. 6D, when tape 29 further travels downstream (arrow c), and component 9, which is a supply target, reaches picking-up port 41a, cover tape 37 is rolled up from bottom tape 36, and component 9 is exposed. Tape retaining member 41 and peeling blade 42 configure component exposing means that peels off a part of cover tape 37 from bottom tape 36, thereby exposing, at supply position P, component 9 in storing recessed portion 36a provided in bottom tape 36.

As illustrated in FIG. 4, tape feed mechanism (tape feeding means) 44 having sprocket 43 is provided in cassette case 30, at a lower position of tape retaining member 41. Sprocket 43 is rotatably supported by rotary shaft 45, and feed hooks 43a are formed at a predetermined pitch on an outer circumference of sprocket 43. When sprocket 43 rotates intermittently in a state in which feed hooks 43a mesh with sprocket holes 36b of tape 29, tape 29 is unwound from supply reel 34 so as to be fed intermittently in a tape feeding direction (to the downstream side). As illustrated in FIGS. 6A and 6D, opening portion 41b for preventing tape retaining member 41 and feed hooks 43a from interfering with each other is formed at a position of tape retaining member 41 which corresponds to sprocket 43.

Figure 7:
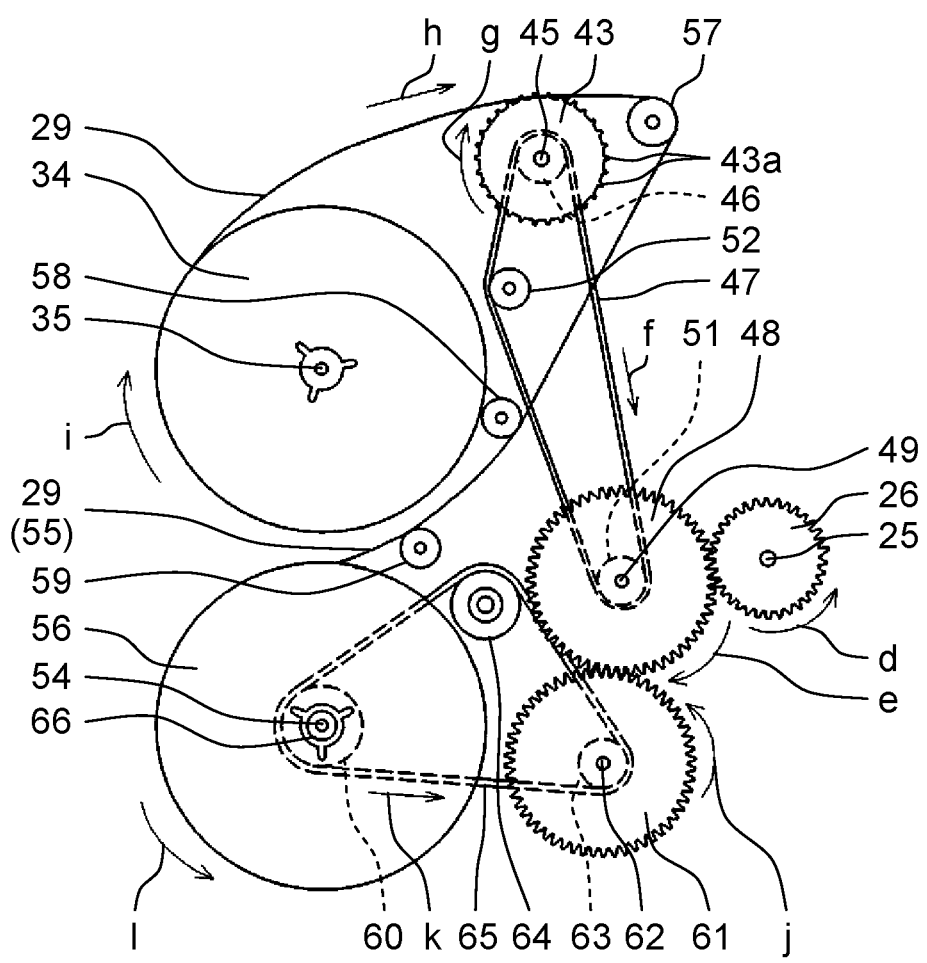
FIG. 7 is a view illustrating a tape feeding operation by the tape feeder according to the exemplary embodiment of the disclosure.

First pulley 46 is coaxially fixed to a side portion of sprocket 43, and first pulley 46 is pivotably supported together with sprocket 43 by rotary shaft 45. First belt (timing belt) 47 is wound around first pulley 46 so as to mesh with a teeth shape formed on an outer circumference of the first pulley (FIG. 7). First belt 47 travels, and thereby sprocket 43 is rotated. Consequently, tape 29 travels. Tape feed mechanism 44 having sprocket 43 unwinds tape 29 from supply reel 34 so as to feed component 9 to supply position P.

Transmission gear (first transmission gear) 48 is provided inside cassette case 30, at a position of side surface 30c opposite to drive device 15. Transmission gear 48 is rotatably supported by rotary shaft 49. Side surface 30c of cassette case 30 is provided with opening portion 50 through which the inside and the outside of cassette case 30 communicate with each other, and a part of transmission gear 48 is exposed to the outside of cassette case 30 via opening portion 50. In a state in which tape feeder 16 is attached to feeder base 14, a teeth portion of transmission gear 48 exposed from cassette case 30 is disposed in cassette case 30 so as to mesh with a teeth portion of drive gear 26 exposed from housing 24. Drive gear 26 and transmission gear 48 mesh with each other through opening portion 20 of bracket 18, and thus it is possible to prevent dust from being attached thereto. Bracket 18 is dust-proof means for preventing dust from being attached at a position at which drive gear 26 meshes with transmission gear 48.

Second pulley 51 is coaxially fixed to a side portion of transmission gear 48, and second pulley 51 is pivotably supported together with transmission gear 48 by rotary shaft 49. First belt 47 is wound around second pulley 51 so as to mesh with a teeth shape formed on the outer circumference of the second pulley. In other words, first belt 47 loops around first pulley 46 and second pulley 51. First belt 47 also abuts, on a traveling path, an outer circumferential surface of guide roller 52 that is rotatably supported by a pin member, and thereby constant tension is imparted to first belt 47.

FIG. 7 schematically illustrates a tape feeding operation. When drive motor 27 is driven, drive gear 26 is rotated in an arrow d direction, and transmission gear 48 that meshes with corresponding drive gear 26 is rotated in an arrow e direction. As transmission gear 48 is rotated, first belt 47 wound around second pulley 51 travels in an arrow f direction. Similarly, first pulley 46, around which first belt 47 is wound, is rotated along with sprocket 43 in an arrow g direction. Consequently, tape 29 is unwound from supply reel 34 such that tape feeding in an arrow h direction is performed, and supply reel 34 is rotated in an arrow i direction. First pulley 46, first belt 47, transmission gear 48, and second pulley 51 configure a drive transmitting mechanism (first drive transmitting mechanism) that transmits, to tape feed mechanism 44, a drive force given from drive device 15.

As described above, tape feeder 16 does not include a drive source in the exemplary embodiment and is configured to transmit the drive force, which is given from drive device 15 that is provided on the side of component installer 1, to the tape feed mechanism via the drive transmitting mechanism. More specifically, drive motor 27 rotates drive gear 26, and thereby the drive force is transmitted to the tape feed mechanism via transmission gear 48. Consequently, it is possible to prevent tape feeder 16 from increasing in size due to providing drive motor 27 and a separate controller from controller 28 on the side of component installer 1, and it is possible to realize a reduction in manufacturing costs of tape feeder 16.

In FIG. 4, tape collector 53 is provided at a lower position of supply-reel storage 33 inside cassette case 30. Tape collector 53 collects a part of tape 29 from which component 9 is picked up from storing recessed portion 36a of bottom tape 36 by nozzle 13 and which is empty. Hereinafter, the part of tape 29 is referred to as a "used tape". Tape collector 53 includes collection reel 56 which is rotatably supported by rotary shaft (pin member) 54 and around which used tape 55 (FIG. 7) is wound.

In FIGS. 4 and 7, a plurality of (here, three) guide rollers 57, 58, and 59 are rotatably supported by pin members on a collecting route of used tape 55 inside cassette case 30. Used tape 55, from which component 9 has been picked up at supply position P and which has been discharged from tape guideway 39, is guided to collection reel 56 while the used tape abuts outer circumferential surfaces of guide rollers 57, 58, and 59.

Next, a structure for rotatably driving collection reel 56 will be described. Third pulley 60 is coaxially fixed to a side portion of collection reel 56, and third pulley 60 is pivotably supported together with collection reel 56 by rotary shaft 54. Transmission gear (second transmission gear) 61 that meshes with transmission gear 48 is provided inside cassette case 30, at a position below corresponding transmission gear 48. Transmission gear 61 is rotatably supported by rotary shaft 62.

Fourth pulley 63 is coaxially fixed to a side portion of transmission gear 61, and fourth pulley 63 is pivotably supported together with transmission gear 61 by rotary shaft 62. Fifth pulley 64 is rotatably supported by a pin member inside cassette case 30, at a position between collection reel 56 and transmission gear 61. Second belt (timing belt) 65 is looped around third pulley 60, fourth pulley 63, and fifth pulley 64 so as to mesh with teeth shapes formed on outer circumferences of the pulleys.

In FIG. 7, when drive motor 27 is driven, drive gear 26 and transmission gear 48 are rotated in respective directions described above; however, at this time, transmission gear 61 that meshes with drive gear 48 is rotated in an arrow j direction. Consequently, second belt 65 travels in an arrow k direction, and further collection reel 56 and fifth pulley 64 are rotated in an arrow l direction. Consequently, used tape 55 is wound around collection reel 56.

As described above, tape collector 53 collects used tape 55 that is a part of tape 29, which has been used for supplying component 9 to the working mechanism at supply position P. In addition, transmission gears 48 and 61, second pulley 51, third pulley 60, fourth pulley 63, fifth pulley 64, and second belt 65 configure a drive transmitting mechanism (second drive transmitting mechanism) that transmits, to rotary shaft 54 of collection reel 56, a drive force given from drive device 15.

As described above, in the exemplary embodiment, tape feeder 16 is configured to transmit the drive force, which is given from drive device 15, to rotary shaft 54 of collection reel 56 via the drive transmitting mechanism. Consequently, it is possible to realize prevention of a further increase in size of tape feeder 16 and a reduction in manufacturing costs.

Torque limiter 66 is attached to rotary shaft 54 of collection reel 56. When a rotational load of a certain value or higher is applied to collection reel 56 as used tape 55 is wound around corresponding collection reel 56, torque limiter 66 causes collection reel 56 to idle with respect to rotary shaft 54. In other words, torque limiter 66 functions as load changing means that changes a load that is applied to collection reel 56, depending on an amount of used tape 55 wound around collection reel 56. That is, torque limiter 66 is an example of a load changer.

In the exemplary embodiment, component installer 1 is configured as described above. Next, a method of manufacturing board 4, on which component 9 is installed, will be described. First, tape feeder 16 supplies component 9 to supply position P (Step (ST) 1: storing-target body supplying step). Subsequently, working head 12 moves to component supplier 8, and component 9 supplied to supply position P is picked up by nozzle 13 (ST2: storing-target body picking up step). Subsequently, working head 12 moves above board 4 transported by board transporting mechanism 7 to a predetermined working position. Nozzle 13 is lifted and lowered with respect to board 4, thereby installing component 9 at an installation point on board 4. That is, supplied component 9 is installed on board 4 by the working mechanism (ST3: installing step). Consequently, board 4, on which component 9 is installed, is manufactured. Then, board 4, on which component 9 is installed, is unloaded by a working machine (not illustrated) on the downstream side.

As described above, in component installer 1 according to the exemplary embodiment, it is possible to provide new tape feeder 16 that does not have a drive source and component installer 1 corresponding to provided tape feeder 16. In addition, since the drive source is not provided, it is possible to achieve simple configuration while tape feeder 16 is prevented from being increased in weight. As a result, it is possible to reduce the manufacturing costs of tape feeder 16. Further, it is possible to expect a cost reduction of a product to be manufactured by component installer 1 in which tape feeder 16 is installed.

The disclosure is not limited to the exemplary embodiment described above and can be appropriately modified in a range without departing from a gist of the disclosure. For example, a granular medicine may be stored as the storing-target body in the tape, and storing-target body picking-up means such as a nozzle may pick up the medicine and transfer the medicine to a storing case as the workpiece. In addition, any combination including the number and disposition of gears and pulleys constituting the drive transmitting mechanism is employed. In addition, the disclosure is not limited to the configuration of component installer 1 except for the configurations of tape feeder 16 described above and a part to which tape feeder 16 is attached, and any configuration may be employed as long as a structure in which a storing-target body can be installed on a workpiece is used.

According to the working machine, the storing-target-body supply device, and the method for manufacturing a workpiece, on which a storing-target body is installed, of the disclosure, it is possible to reduce costs in a simplified configuration, and the disclosure is particularly applicable to a mounting field of manufacturing a board on which a component is installed, for example.

What is claimed is:

1. A working machine that causes a working mechanism to install, on a workpiece, a storing-target body stored in a tape, the working machine comprising:
    a storing-target-body supply device that supplies the storing-target body stored in the tape to the working mechanism; and
    a drive device that gives a drive force to the storing-target-body supply device,
    wherein the storing-target-body supply device includes:
    a supply-reel storage that stores a supply reel around which the tape storing the storing-target body is wound,
    a tape feed mechanism that unwinds the tape from the supply reel so as to feed the storing-target body to a predetermined supply position,
    a drive transmitting mechanism that transmits, to the tape feed mechanism, the drive force given from the drive device, and
    a housing that accommodates the supply-reel storage, the tape feed mechanism, and the drive transmitting mechanism within the housing, wherein the drive device is arranged outside of the housing and transmits the drive force to the drive transmitting mechanism accommodated by the housing.

2. The working machine of claim 1,
    wherein the drive device includes a drive gear and a drive motor that rotatably drives the drive gear,
    wherein the drive transmitting mechanism includes a transmission gear that meshes with the drive gear, and
    wherein the drive motor rotates the drive gear to transmit the drive force to the tape feed mechanism via the transmission gear.

3. The working machine of claim 2, wherein the housing has an opening portion, and a part of the transmission gear is exposed to the outside of the housing via the opening portion.

4. The working machine of claim 2, wherein the drive device has a housing that is separate from the housing of the storing-target-body supply device and accommodates the drive gear and drive motor within the housing of the drive device.

5. The working machine of claim 4, wherein the housing of the drive device has an opening portion, and a part of the drive gear extends through the opening portion and outside of the housing of the drive device.

6. The working machine of claim 1,
    wherein the storing-target-body supply device further includes a tape collector that collects a used tape, the used tape being a part of the tape that has been used for supplying the storing-target body to the working mechanism at the predetermined supply position,
    wherein the tape collector includes a collection reel which is rotatably supported by a rotary shaft and around which the used tape is wound, and
    wherein the drive transmitting mechanism further transmits, to the rotary shaft, the drive force given from the drive device.

7. The working machine of claim 6, further comprising:
    a load changer that is disposed on the rotary shaft and changes a load depending on an amount of the used tape wound around the collection reel.

8. The working machine of claim 1, further comprising:
an attaching portion to which the storing-target-body supply device is detachably attached and the drive device is attached.

9. The working machine of claim 8,
wherein the drive device includes a drive gear and a drive motor that rotatably drives the drive gear, and
wherein the drive motor rotates the drive gear to transmit the drive force to the tape feed mechanism provided in the storing-target-body supply device.

10. The working machine of claim 1, wherein the housing has an opening portion, and a portion of the drive device extends into the opening portion of the housing.

11. The working machine of claim 1, wherein the drive device includes a drive gear and a drive motor that rotatably drives the drive gear, and the housing does not contain the drive motor.

12. The working machine of claim 1, further comprising a base, wherein the drive device and storing-target-body supply device are removably coupled to the base.

13. A storing-target-body supply device that supplies a storing-target body stored in a tape, the device comprising:
a supply-reel storage that stores a supply reel around which the tape storing the storing-target body is wound,
a tape feed mechanism that unwinds the tape from the supply reel so as to feed the storing-target body to a predetermined supply position,
a drive transmitting mechanism that transmits a drive force to the tape feed mechanism, and
a housing that accommodates the supply-reel storage, the tape feed mechanism, and the drive transmitting mechanism within the housing, wherein the drive force is generated outside of the housing and transmits the drive force to the drive transmitting mechanism accommodated by the housing.

14. The storing-target-body supply device of claim 13,
wherein the drive transmitting mechanism includes a transmission gear, and
wherein the transmission gear is rotated by the drive force given from the outside and rotation of the transmission gear causes the drive force to be transmitted to the tape feed mechanism.

15. The storing-target-body supply device of claim 13, further comprising:
a tape collector that collects a used tape, the used tape being a part of the tape that has been used for supplying the storing-target body at the predetermined supply position,
wherein the tape collector includes a collection reel which is rotatably supported by a rotary shaft and around which the used tape is wound, and
wherein the drive transmitting mechanism further transmits, to the rotary shaft, a drive force given from the outside.

16. The storing-target-body supply device of claim 15, further comprising:
a load changer that is disposed on the rotary shaft and changes a load depending on an amount of the used tape wound around the collection reel.

17. The storing-target-body supply device of claim 13, wherein the housing does not contain a drive motor.

18. A method for manufacturing a workpiece on which a storing-target body is installed, the method comprising:
a storing-target-body supplying step of supplying the storing-target body to a predetermined supply position by using a working machine, the working machine including:
a storing-target-body supply device that supplies the storing-target body stored in a tape to a working mechanism; and
a drive device that gives a drive force to the storing-target-body supply device,
the storing-target-body supply device including:
a supply-reel storage that stores a supply reel around which the tape storing the storing-target body is wound;
a tape feed mechanism that unwinds the tape from the supply reel so as to feed the storing-target body to the predetermined supply position;
a drive transmitting mechanism that transmits, to the tape feed mechanism, the drive force given from the drive device; and
a housing that accommodates the supply-reel storage, the tape feed mechanism, and the drive transmitting mechanism within the housing, wherein the drive device is arranged outside of the housing and transmits the drive force to the drive transmitting mechanism accommodated by the housing, and
an installing step of installing the supplied storing-target body on the workpiece by using the working mechanism.

19. The method of claim 18, wherein the drive device includes a drive gear and a drive motor that rotatably drives the drive gear, and the housing does not contain the drive motor.

* * * * *